United States Patent
Mohseni et al.

(10) Patent No.: US 6,687,870 B1
(45) Date of Patent: Feb. 3, 2004

(54) METHOD AND APPARATUS FOR INTERLEAVING FOR INFORMATION TRANSMISSION OR STORAGE APPLICATIONS

(75) Inventors: Jafar Mohseni, San Diego, CA (US); Brian Butler, La Jolla, CA (US); Deepu John, San Diego, CA (US); Haitao Zhang, San Diego, CA (US)

(73) Assignee: Qualcomm, Incorporated, San Deigo, CA (US)

( * ) Notice: Subject to any disclaimer, the term of this patent is extended or adjusted under 35 U.S.C. 154(b) by 0 days.

(21) Appl. No.: 09/406,173

(22) Filed: Sep. 23, 1999

(51) Int. Cl.⁷ .............................................. H03M 13/00
(52) U.S. Cl. ....................... 714/762; 711/217
(58) Field of Search ................ 714/746, 762, 714/755, 756, 796; 711/217, 169, 211, 219, 221, 5; 708/404; 370/479, 320, 335, 342, 441; 375/240.18

(56) References Cited

U.S. PATENT DOCUMENTS

| | | | | |
|---|---|---|---|---|
| 4,583,190 A | * | 4/1986 | Salb ........................... | 708/404 |
| 4,736,307 A | * | 4/1988 | Salb ........................... | 128/920 |
| 5,410,546 A | * | 4/1995 | Boyer et al. ................ | 714/763 |
| 5,659,781 A | * | 8/1997 | Larson ........................ | 712/11 |
| 6,304,581 B1 | * | 10/2001 | Chen et al. ................. | 370/320 |
| 6,304,991 B1 | * | 10/2001 | Rowitch et al. ............ | 714/755 |

| | | | | |
|---|---|---|---|---|
| 2002/0012397 A1 | * | 1/2002 | De With et al. ........ | 375/240.18 |

OTHER PUBLICATIONS

Postula et al. (Automated synthesis of interleaved memory systems for custom computing machines; IEEE, On page(s): 115–122 vol. 1, Aug. 25–27, 1998).*
Al–Mouhamed et al. (A heuristic storage for minimizing access time of arbitrary data patterns; IEEE, On page(s): 441–447, Apr. 1997).*
Al–Mouhamed et al. (A compiler address transformation for conflict–free access of memories and networks ; IEEE, On page(s): 530–537, Oct. 23–26, 1996).*
Thapar (Interleaved dual tag directory scheme for cache coherence; IEEE, On page(s): 546–553, Jan. 4–7, 1994).*
Lam et al. (A new storage scheme for conflict–free vector access; IEEE, On page(s): 32–35 vol. 1, Oct. 19–21, 1993).*

* cited by examiner

*Primary Examiner*—Guy J. Lamarre
(74) *Attorney, Agent, or Firm*—Philip R. Wadsworth; Charles D. Brown; Howard H. Seo

(57) ABSTRACT

Interleavers are used in data transmission and storage applications to introduce diversity into a data stream, thereby making adjacent symbols more independent with respect to a transfer environment of variable quality. Conventional interleavers require storage in whole units of data blocks. This storage requirement complicates implementations for applications where available circuit area is limited and data rates and block sizes are large. A novel interleaver produces an interleaved data block using storage space that is only a fraction of the size of the input data block.

32 Claims, 22 Drawing Sheets

FIG. 3C $0 = 000 \rightarrow 000 = 0$
$1 = 001 \rightarrow 100 = 4$
$2 = 010 \rightarrow 010 = 2$
$3 = 011 \rightarrow 110 = 6$
$4 = 100 \rightarrow 001 = 1$
$5 = 101 \rightarrow 101 = 5$
$6 = 110 \rightarrow 011 = 3$
$7 = 111 \rightarrow 111 = 7$

METHOD AND APPARATUS FOR INTERLEAVING FOR INFORMATION TRANSMISSION OR STORAGE APPLICATIONS

BACKGROUND OF THE INVENTION

1. Field of the Invention

This invention relates to the transmission or storage of digital data, and specifically to the dispersion of redundancy in digital data for transmission or storage.

2. Description of Related Art and General Background

Digital techniques are becoming increasingly widespread in applications for the transmission or storage of information. One advantage of using digital rather than analog techniques in such applications is that once information has been generated in or transformed into digital form, it is possible to preserve it in an endless variety of different media, or to transmit it over virtually any kind of channel, as a perfect copy of the digital source. In contrast, it is essentially impossible to transmit or transfer analog information without degrading it to some extent. Some of the areas where digital techniques may be applied are voice, data, and video communications and image, data, and document storage, processing, and archiving.

Unfortunately, because storage media and transmission channels are not perfect, they tend to alter the digital information passing through them, eventually introducing errors. In a storage medium, for example, errors may arise because of defects which prevent some or all of the digital information from being properly stored, retained, or retrieved. In a transmission channel, errors may arise because of, e.g., interference from another signal or variations in channel quality due to a fading process.

In some cases, errors will have only a localized effect. For example, an error introduced into a digital representation of a picture (e.g. by a piece of dust on a CD-R blank or by a momentary deep fade in a transmission channel) may affect only one pixel or a few adjacent pixels, leaving the rest of the representation uncorrupted. In other cases, however, the introduction of a single error may be catastrophic, rendering the entire body of information unusable.

Theoretically, it is impossible to determine from the information alone what portion of it is erroneous, or even to know that an error has occurred. Therefore, digital transmission or storage operations typically introduce a redundant factor so that some degree of confidence in the accuracy of the information may be obtained upon receipt or retrieval. Common implementations of redundancy factors include parity bits and cyclic redundancy check (CRC) checksums, which are usually calculated upon blocks (also called 'frames') of adjacent symbols. Memory systems that incorporate parity, for example, commonly add one check bit to every eight-bit byte, while a CRC checksum is commonly appended to the block of data that it characterizes. Note that the incorporation of such factors constitutes system overhead, as it requires additional processing and also reduces the effective transmission or storage capacity of the system.

Frequently, it is not enough simply to detect errors, and some provision must be made to correct them as well. In many digital wireless communications, for example, a certain error rate is expected to be encountered. If it were necessary to retransmit all of the corrupted frames, the data throughput could be reduced so severely that the system would have little practical value. In storage applications, if data stored on an imperfect medium has been corrupted, it is possible that repeated readings would yield only the same corrupted information, and in this case the data and any other information depending on it might be irretrievably lost if the errors could not be corrected.

Therefore, enough redundancy should be provided in such applications so that data corrupted by errors at the expected rate may not only be detected but may also be corrected. Devices such as convolutional, Reed-Solomon, concatenated, or turbo codes are commonly used to provide such redundancy and are referred to in this context as forward error correction (FEC) codes. Typically, data frames are individually processed using one or more of these codes, and the resulting redundancy checksums are appended to the frames they represent.

When errors occur, they tend to corrupt a number of adjacent symbols. A defect in a storage medium will affect a number of consecutive storage locations, for example, while a deep fade in a transmission channel will distort any sequence of bits transmitted within its duration. In digital signal transmission, errors with this characteristic are called burst errors.

A high degree of redundancy may be needed to recover the information lost to a burst error, as the error may decimate a large portion of the affected data frame. During those portions of the signal where no errors occur, however, the considerable complexity and overhead incurred by incorporating a high degree of redundancy are wasted. This inefficiency arises in part because when the redundant information remains local to the data it represents, the signal continues to be susceptible to long burst errors.

One way to disperse the information redundancy and thereby increase code efficiency is through interleaving, or rearranging the sequential order of the symbols in some predetermined fashion. By spreading the redundancy across a larger set of data, interleaving makes it possible for less powerful codes to overcome the effects of a burst error. To express this concept in a different way, interleaving introduces diversity in time or space by making adjacent symbols independent in a time-variable or space-variable process (such as a fading transmission channel or storage onto an imperfect medium).

While it is desirable to obtain as much diversity in the interleaver output as possible, note that the degree of diversity provided by an interleaver is directly related to three costs: (1) the time by which the data transfer is delayed, (2) the complexity of the addressing scheme, and (3) the size of the storage space or 'scratchpad' needed to hold the symbols so that their sequence may be rearranged. The time delay factor may not be important in storage applications, although it becomes more of a concern in time-sensitive areas such as telephony and other communications applications. The complexity factor shrinks in importance as advances in processing speed continue to outstrip advances in memory access times. As data rates and frame lengths increase, however, the space cost is becoming more of an obstacle.

In terms of circuit area, RAM storage can be very expensive in a small device where space is limited. Moreover, it is often desirable to build an entire processing circuit including the interleaver on a single chip, in which case fabrication techniques may require that static RAM be used. Because static RAM uses more space than other RAM implementations, up to 50% or more of the available chip area may ultimately be consumed by the scratchpad.

SUMMARY OF THE INVENTION

The novel method and apparatus for interleaving as described herein performs an interleaving function on a block of data symbols, in that the block of symbols is inputted in one order and outputted in a different order. A principal advantage of the novel method and apparatus is that the interleaving function is performed using a scratchpad that is smaller than the block of symbols.

BRIEF DESCRIPTION OF THE DRAWINGS

FIG. 3A shows a block of symbols for transmission or storage.

FIG. 3B shows the block of FIG. 3A after a particular form of block interleaving.

FIG. 3C shows the block of FIG. 3B after a particular form of block interleaving with bit-reversed addressing.

DETAILED DESCRIPTION OF THE INVENTION

In one class of interleaving methods known as block interleaving, and input sequence of data symbols is divided into blocks of predetermined size, and the interleaving function is performed on each block as a discrete unit. General principles of block interleaving are well known in the art, and discussions of their application may be found in many different sources. Block interleaving functions are also included in a recent version of the Communications Toolbox for MATLAB, a computer programming package produced by TheMathWorks, Inc., Natick, Mass. that is widely used for signal processing.

Figure 1:
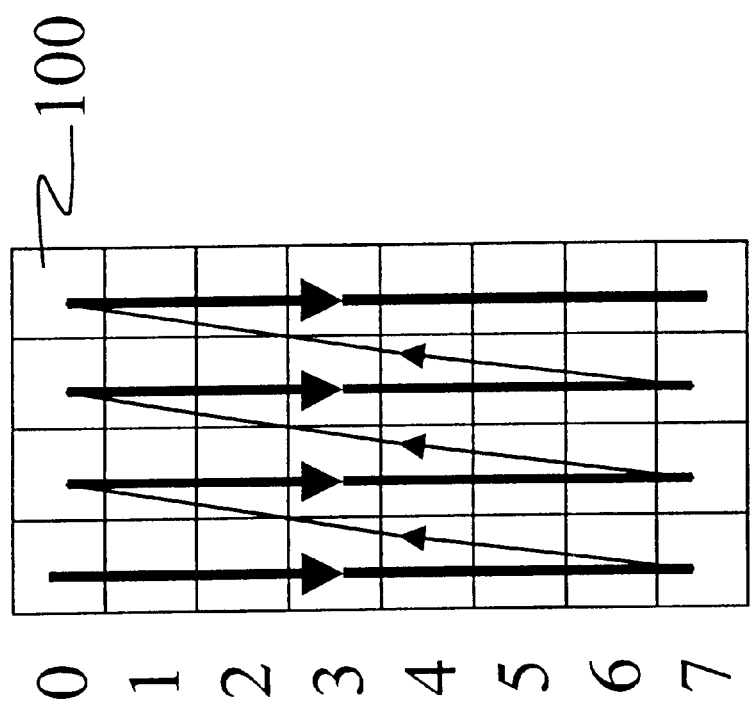
FIG. 1 shows an access operation upon scratchpad 100 using column addressing.
Figure 2:
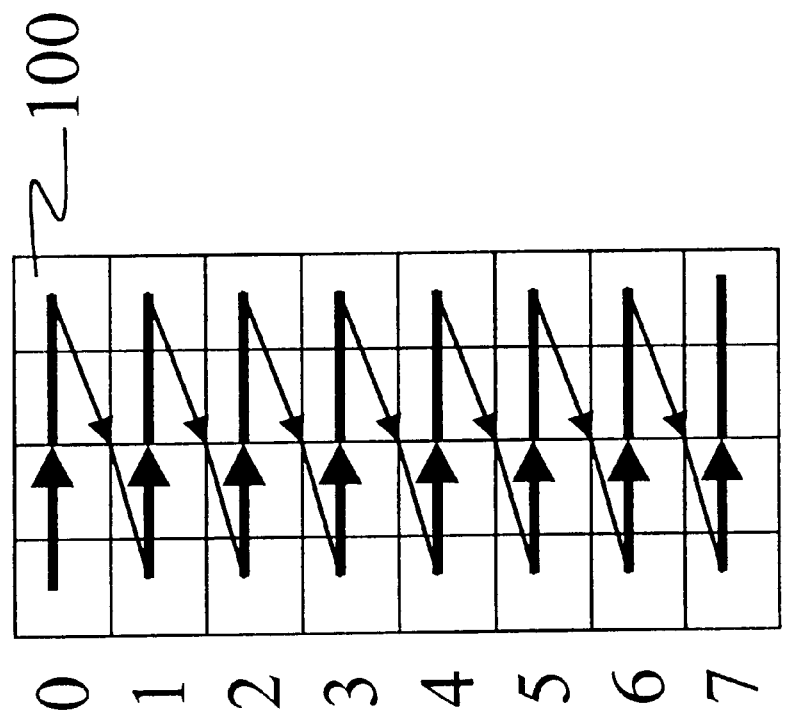
FIG. 2 shows an access operation upon scratchpad 100 using row addressing.
Figures 3A, 3B, 3C:
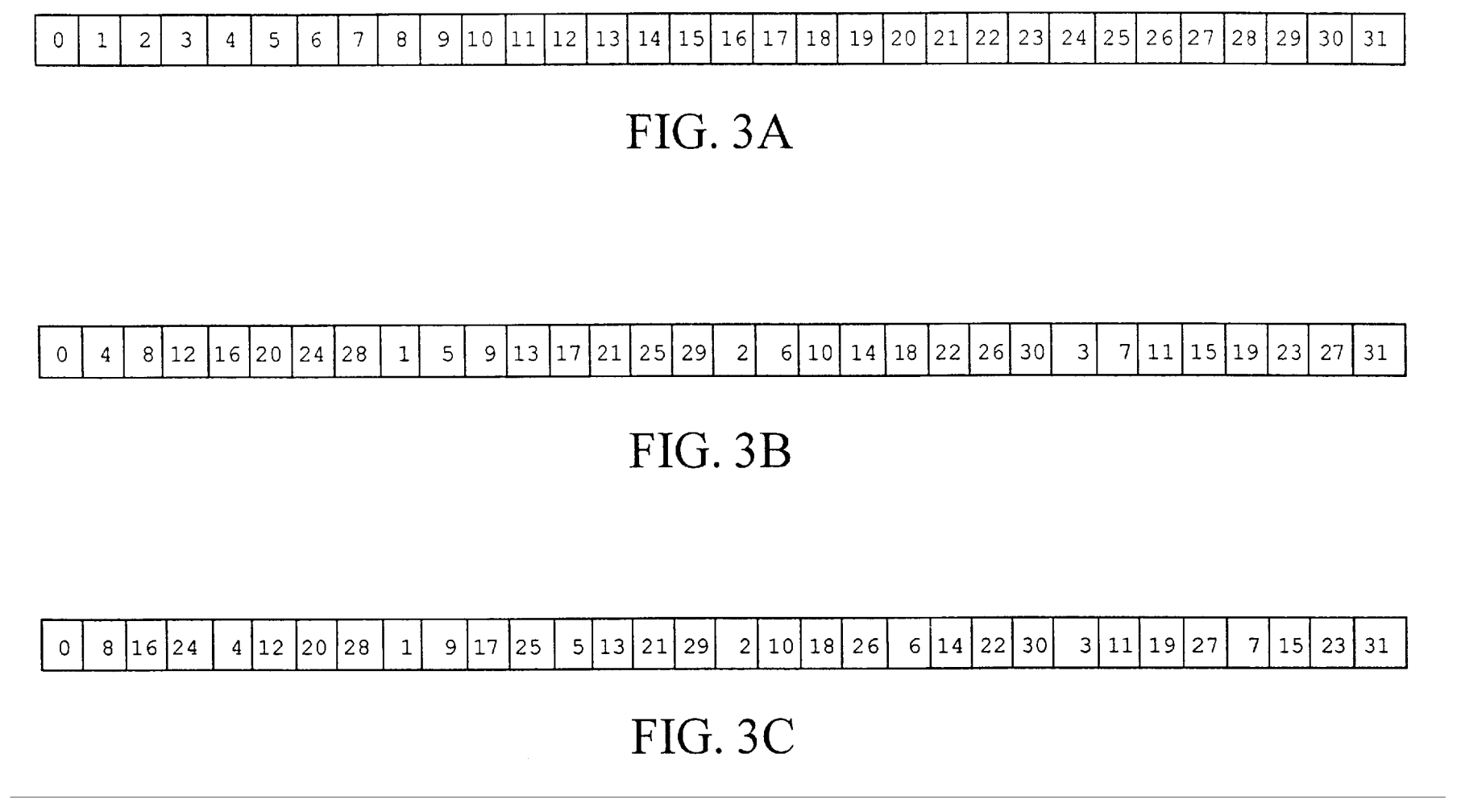

One way to perform block interleaving is to use a scratchpad storage area such as a random-access memory. The scratchpad is considered to be a R×C array of storage elements (where R is the number of rows, C is the number of columns, and R×C is the number of data symbols in a block), even though the scratchpad may in fact be physically configured as a linear array of storage elements. In one example, the interleaving operation is performed by writing each input block of data into the scratchpad by columns and then reading out the data by rows. This two-stage procedure is graphically illustrated in FIGS. 1 and 2 for a scratchpad of size 8 rows by 4 columns, where FIG. 1 shows the writing-by-columns operation and FIG. 2 shows the reading-by-rows operation. In these figures (as in FIGS. 4, 5, 6, and 7), the arrows indicate the sequence in which the storage elements are addressed, with an arrow in bold indicating a read or write access to the underlying storage element. Performing the two-stage procedure of FIGS. 1 and 2 upon the 32-symbol block shown in FIG. 3A produces the interleaved sequence of FIG. 3B.

An example pseudocode segment follows which implements the function demonstrated in FIGS. 1 and 2. In this example, $M(a,b)$ denotes the element of the scratchpad at row a and column b; $X(d)$ and $Y(d)$ denote the d-th element of the input and output blocks, respectively, each block containing R×C symbols; i, j, and n are index variables; and '++' denotes the auto-postincrement function:

```
n=0;
FOR j=0:C-1
    FOR i=0:R-1
        M(i,j) = X(n++);
    end
end
n=0;
FOR i=0:R-1
    FOR j=0:C-1
        Y(n++) = M(i,j);
    end
end
```

A principal advantage of block interleaving is an increased robustness to burst errors. In the particular form discussed above, for example, no burst error of length up to C symbols can affect adjacent symbols within a single block. One may easily verify this advantage by considering FIG. 4, wherein a complete data transfer is shown from interleaving to de-interleaving in consecutive stages I through IV. Stages I and II show the writing and reading operations illustrated in FIGS. 1 and 2, respectively. Between stages II and III the data is transferred, incurring a burst error of length C symbols. In stages III and IV the de-interleaving is performed by carrying out the operations of stages I and II in reverse order, wherein the C symbols corrupted by the burst error are denoted by shading. Clearly, none of the corrupted symbols are adjacent in the output produced at stage IV.

Figure 4:
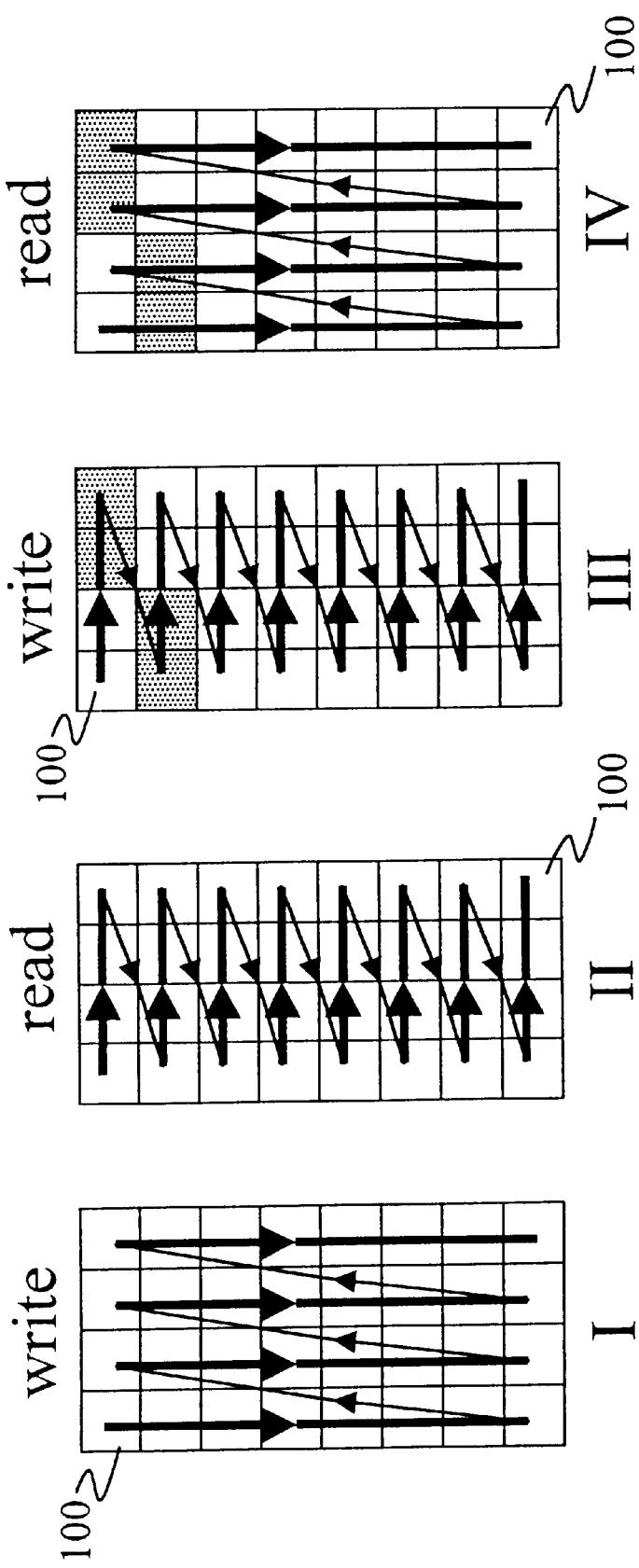
FIG. 4 shows four stages A through D in a transfer of a block via a particular form of block interleaving, wherein a burst error of length C symbols is encountered during the transfer.

One may also note from FIG. 4, however, that a burst error of length greater than C symbols may affect adjacent symbols. Depending on the characteristics of the particular FEC code that was applied to the input data stream and the expected nature of the intervening transmission channel or storage medium, the diversity introduced by such an interleaving technique may be insufficient to provide the required degree of confidence in the decoded information.

Figure 5:
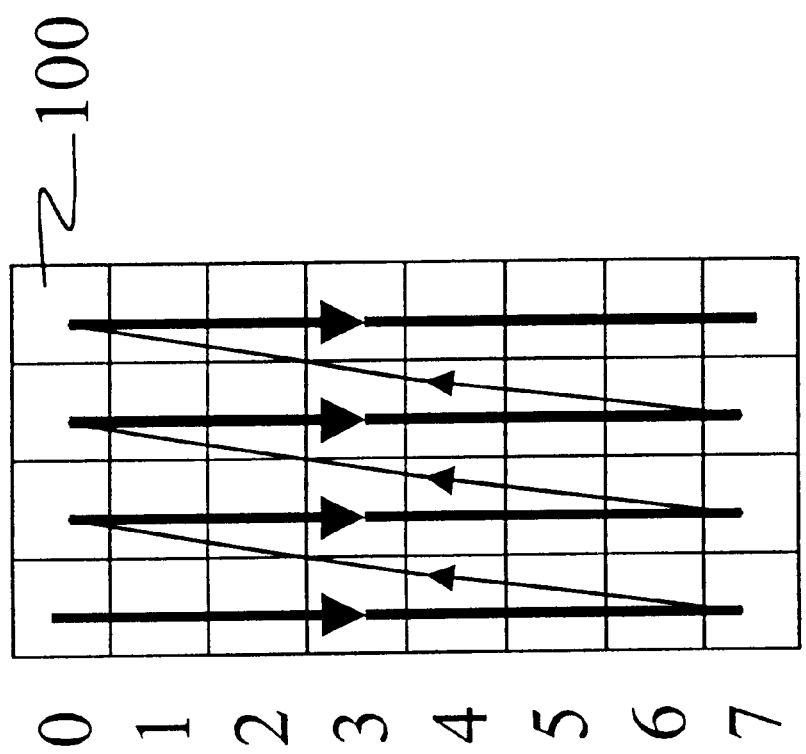
FIG. 5 shows an access operation upon scratchpad 100 using column addressing.
Figure 6:
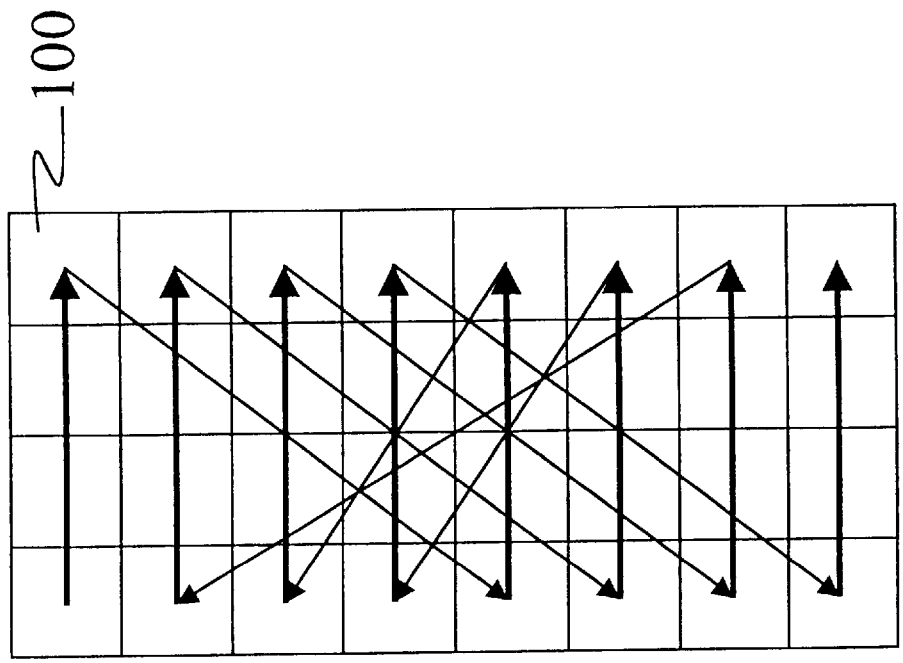
FIG. 6 shows an access operation upon scratchpad 100 using row addressing via bit-reversed addressing.
Figure 7:
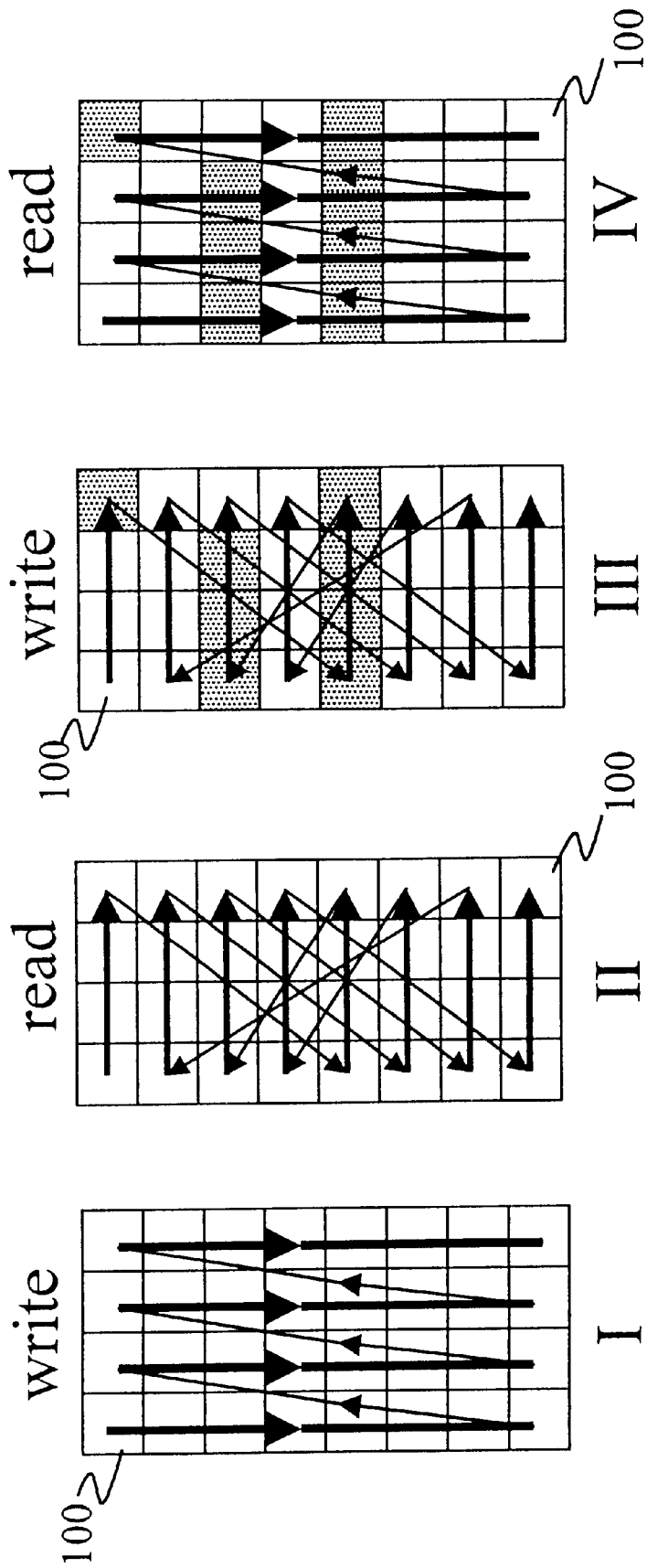
FIG. 7 shows four stages A through D in a transfer of a block via a particular form of block interleaving via bit-reversed addressing, wherein a burst error of length 2C symbols is encountered during the transfer.

A modification that is more robust to large burst errors may be obtained by using block interleaving together with bit-reversed addressing. As shown in FIG. 5, the writing-by-columns operation in this example is the same as in FIG. 1. The subsequent reading operation, as shown in FIG. 6, is modified so that the order by which the rows are read is determined by reversing the bit order of the binary expressions of each row number. Performing the two-stage procedure of FIGS. 5 and 6 upon the 32-symbol block shown in FIG. 3A produces the interleaved sequence of FIG. 3C. From the complete data transfer diagram of FIG. 7 (wherein stages I and II correspond to the operations shown in FIGS. 5 and 6, respectively, and in stages III and IV those operations are performed in reverse order), one may easily see that even a burst error of length 2C symbols will not corrupt adjacent symbols within the same block.

An example pseudocode segment follows which implements the function demonstrated in FIGS. 5 and 6, where the notations are as indicated above and T denotes a lookup vector of length R which maps each row number to its bit-reversed counterpart. For R=8, for example, T={0, 4, 2, 6, 1, 5, 3, 7}:

```
n=0;
FOR j=0:C-1
    FOR i=0:R-1
        M(i,j) = X(n++);
    end
end
n=0;
FOR i=0:R-1
    FOR j=0:C-1
        Y(n++) = M(T(i),j);
    end
end
```

Figure 8A:
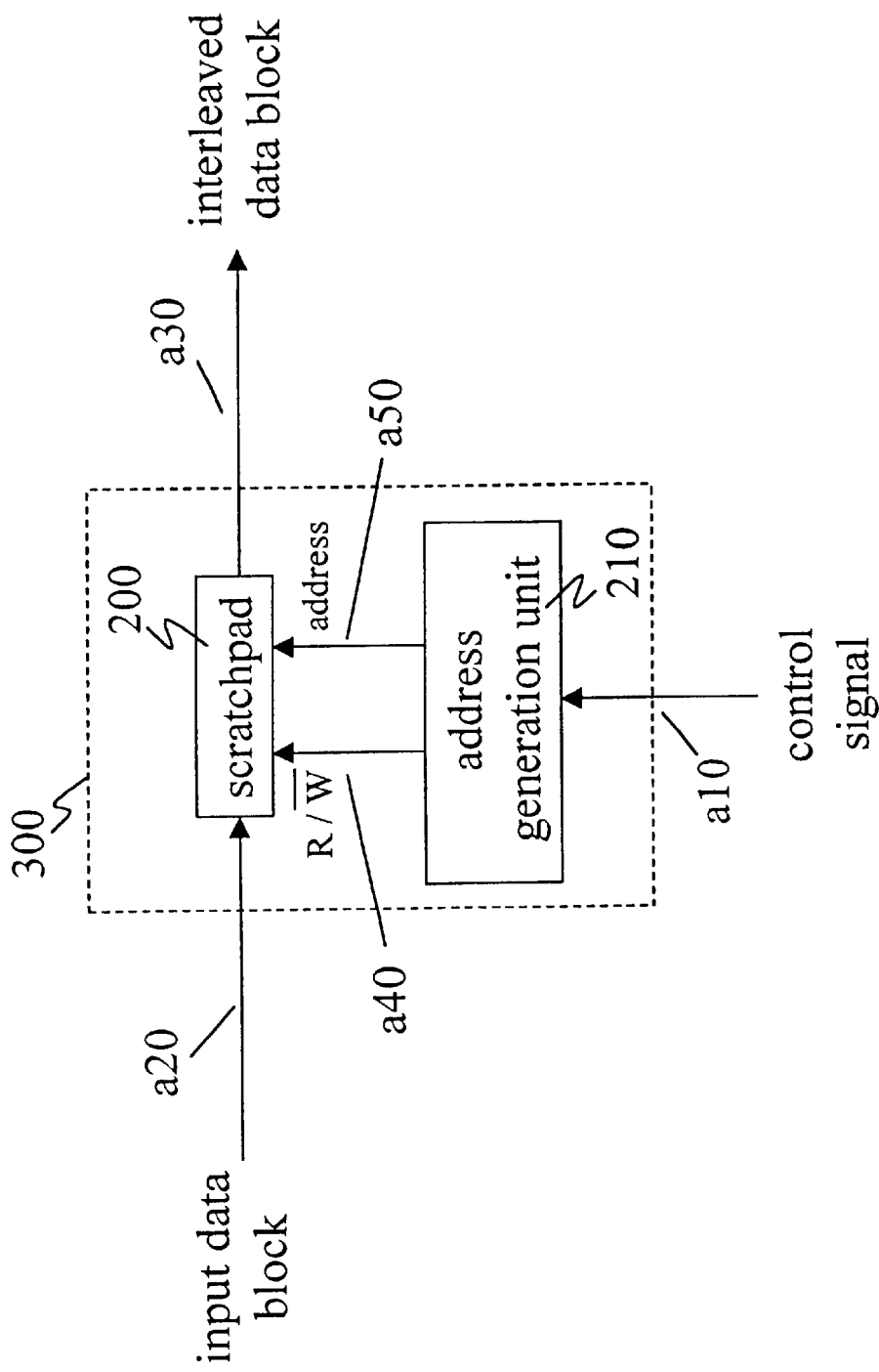
FIG. 8A shows an interleaver 300 according to a first embodiment of the invention.

As shown in FIG. 8A, an interleaver 300 according to a first embodiment of the invention comprises a scratchpad 200 and an address generation unit 210. Scratchpad 200 receives symbols over signal a20, stores input symbols or accesses stored symbols according to a mode select signal a40 (also called a read/not write or R/$\overline{\text{W}}$ signal) provided by address generation unit 210 and an address provided by address generation unit 210 over signal a50, and outputs symbols over signal a30. A principal advantage of an interleaver according to the embodiments of the invention as described herein and their equivalents is that the size of the scratchpad is less than the size of the data block for the particular interleaving scheme being implemented, thereby reducing the amount of circuit area occupied by the scratchpad. Application of the invention thus allows a system designer to leverage available processing capacity against storage area requirements and facilitates the implementation of an entire data processing circuit on a single chip.

Figure 9A:
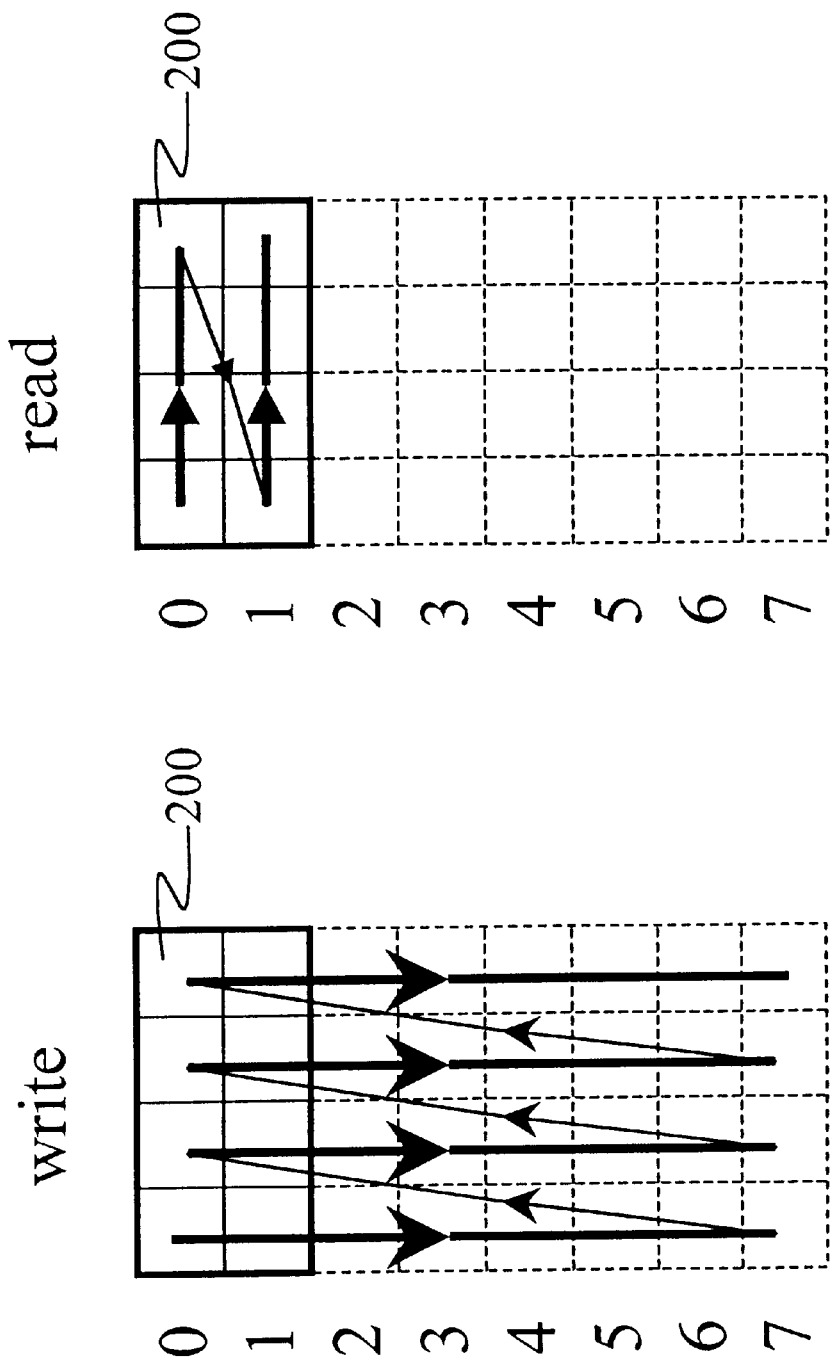
FIGS. 9A through 9D show four stages in an application of an interleaver according to a first embodiment of the invention to perform a block interleaving operation on an input block.

FIGS. 9A through 9D demonstrate how an interleaving operation according to the 8×4 block interleaving scheme discussed above may be performed in four two-cycle stages using interleaver 300. In the first stage, as shown in FIG. 9A, the data block to be interleaved is inputted to interleaver 300. In the write cycle of this stage, a first portion of the block is stored into scratchpad 200 using column addressing (in this example, scratchpad 200 comprises eight storage elements, and the first portion of the block corresponds to the first and second interleaved rows). Note that although the entire set of addressing and access arrows are shown in FIG. 9A (and also in FIGS. 9B–D and 10A–D), addresses not within the current address space of the scratchpad are not valid and need not be generated or accessed. In the read cycle of this stage, the stored portion is outputted, using row addressing, as the first part of the interleaved block.

Figure 9B:
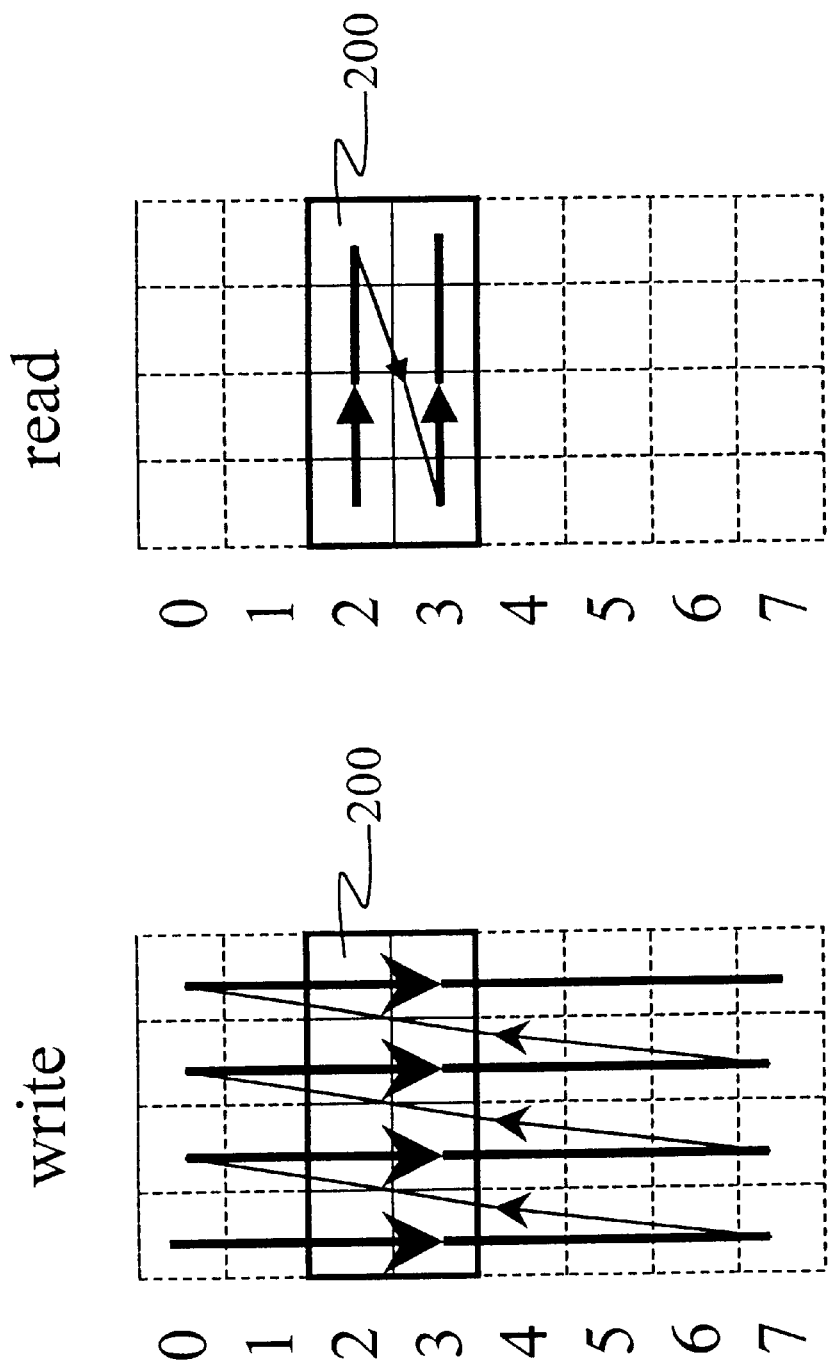
Figure 9C:
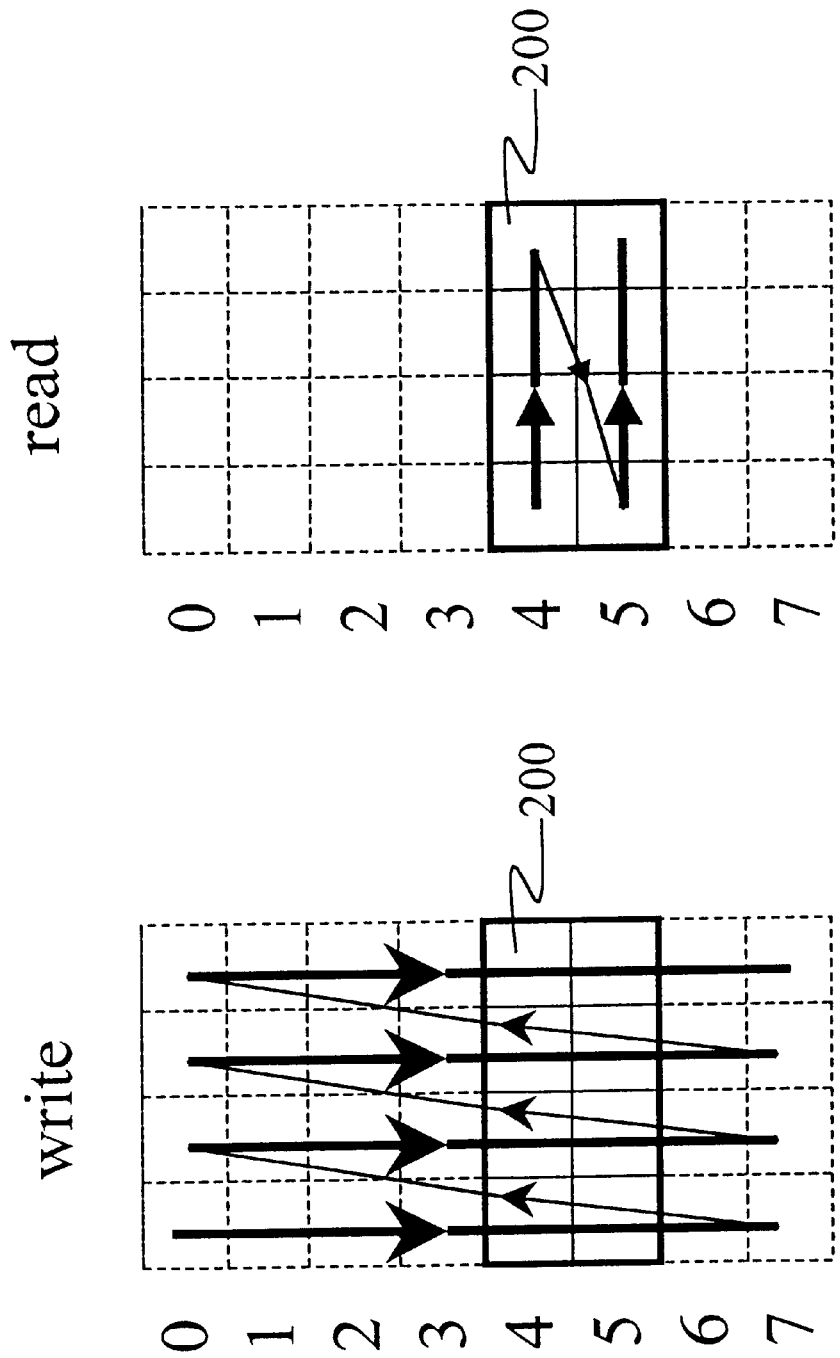
Figure 9D:
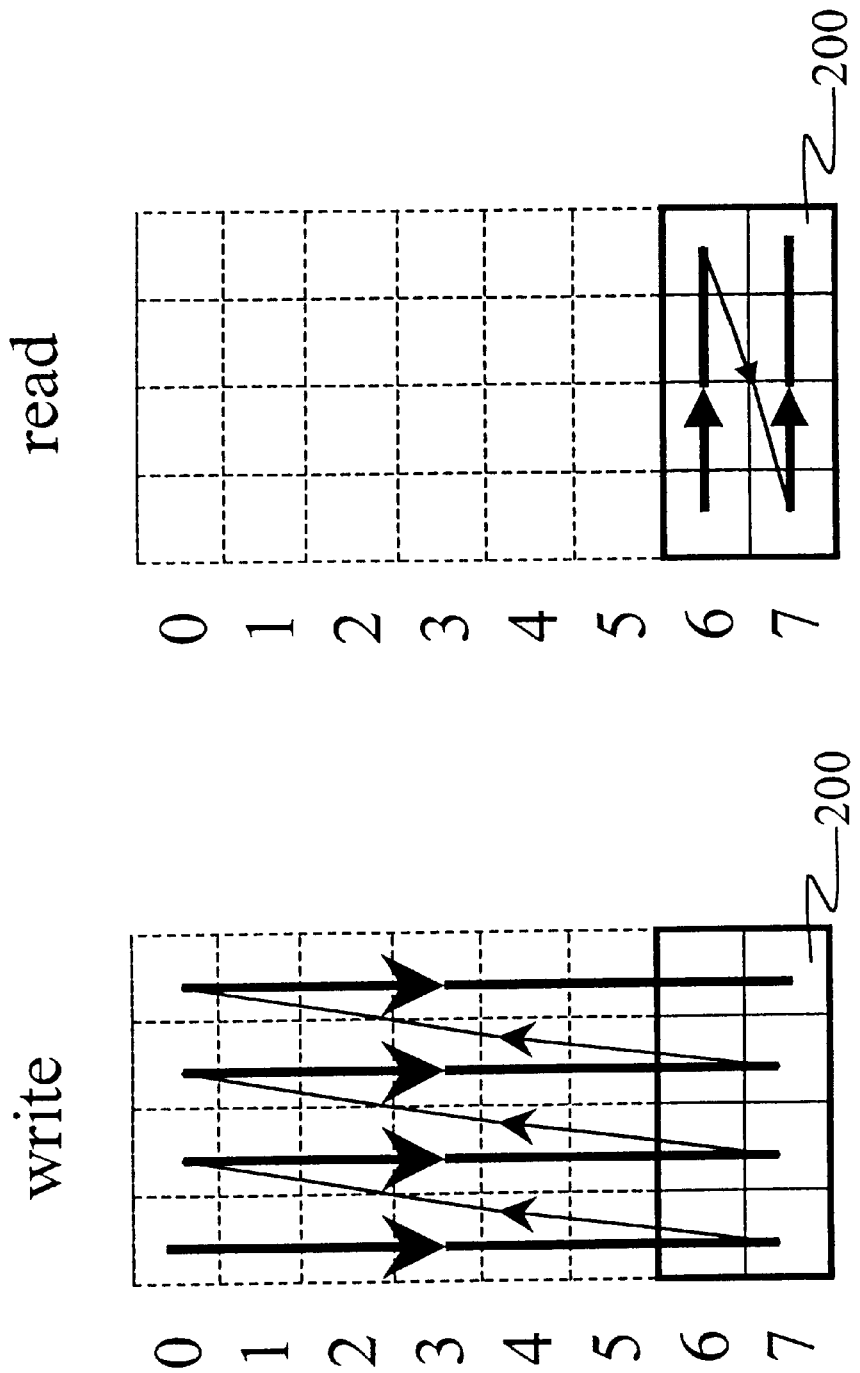
Figure 10A:
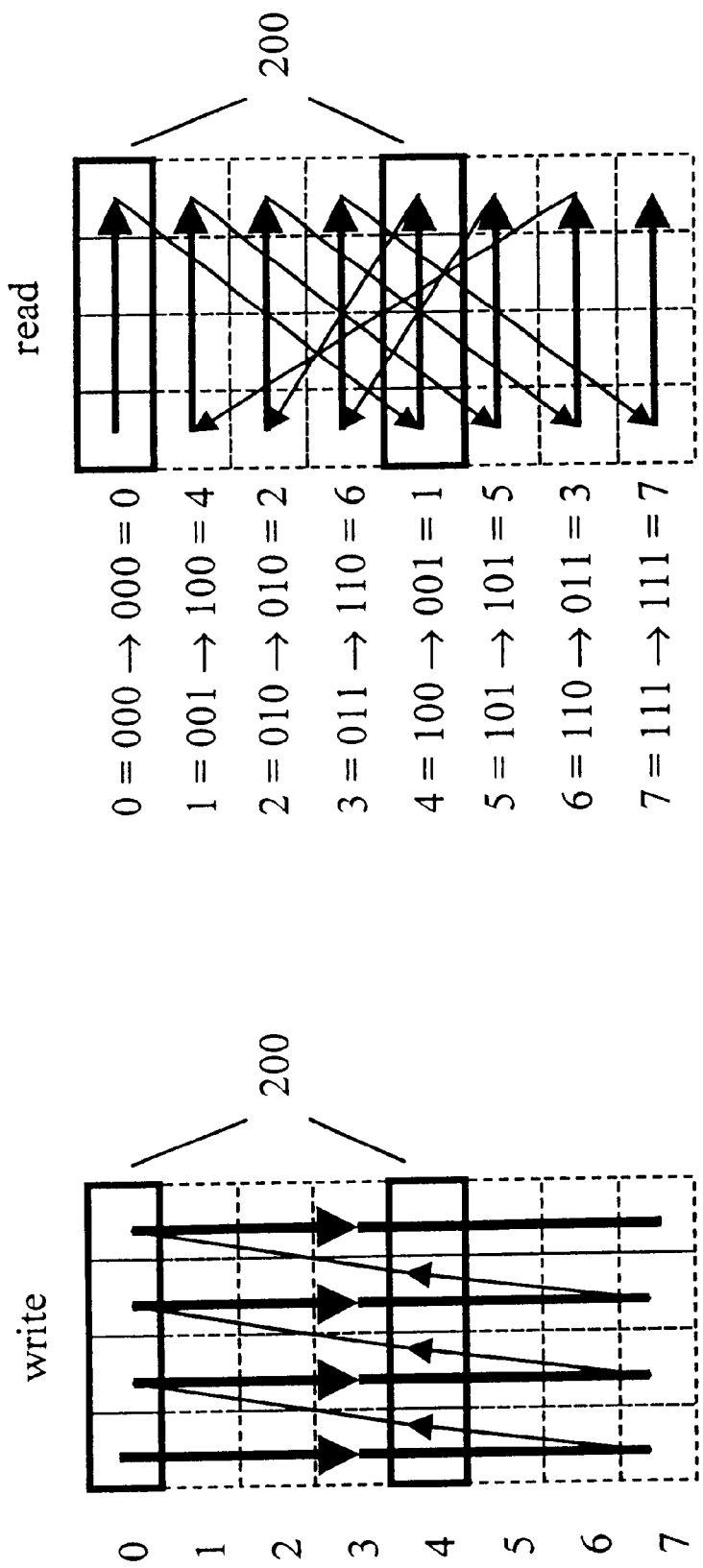
FIGS. 10A through 10D show four stages in an application of an interleaver according to a second embodiment of the invention to perform a block interleaving operation via bit-reversed addressing on an input block.
Figure 10B:
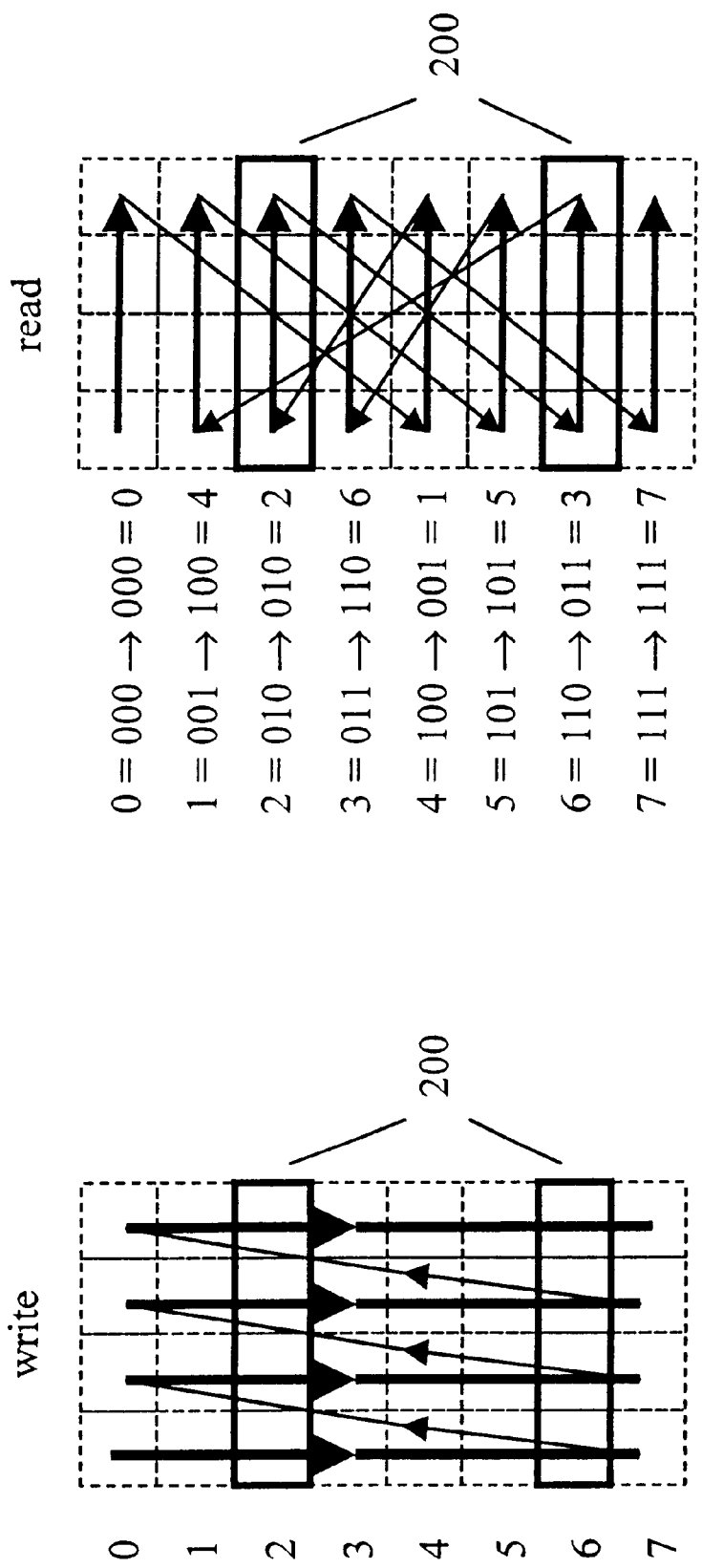
Figure 10C:
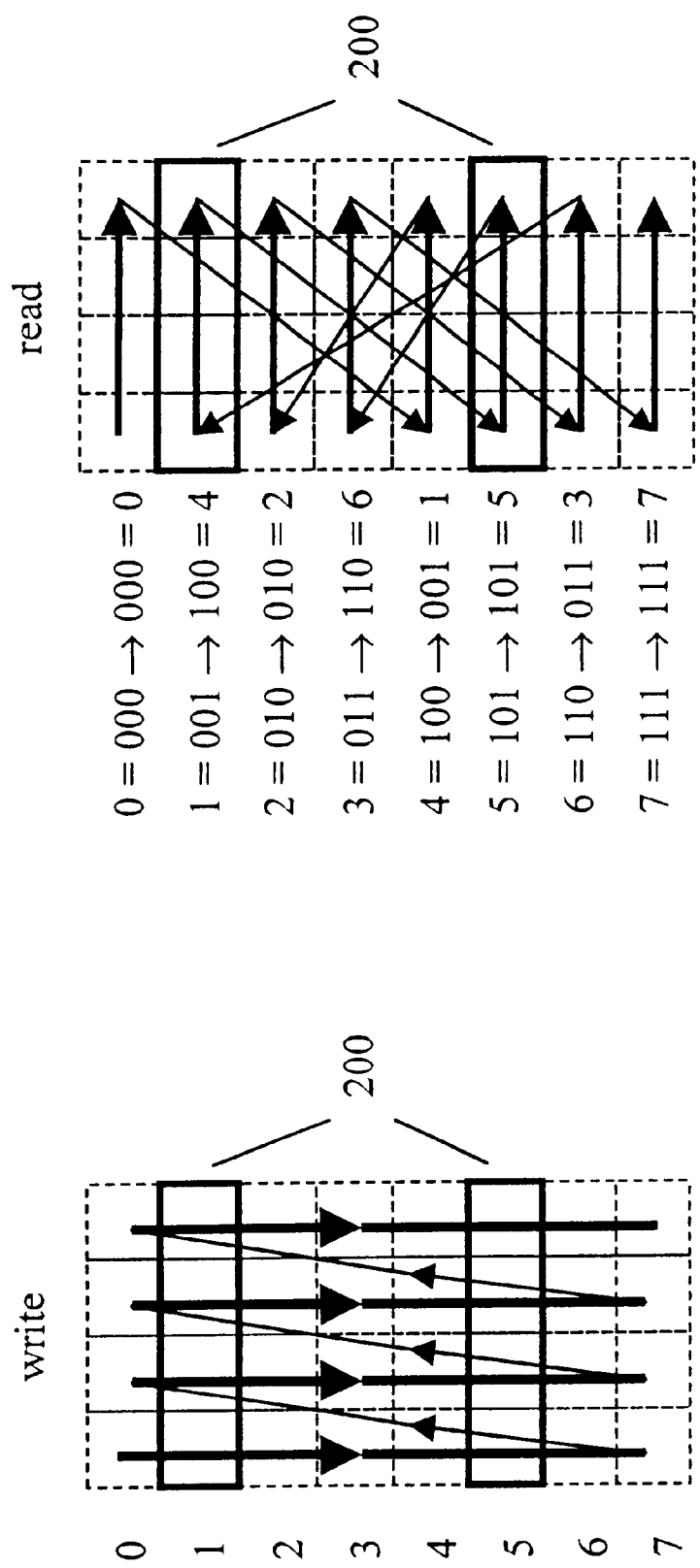
Figure 10D:
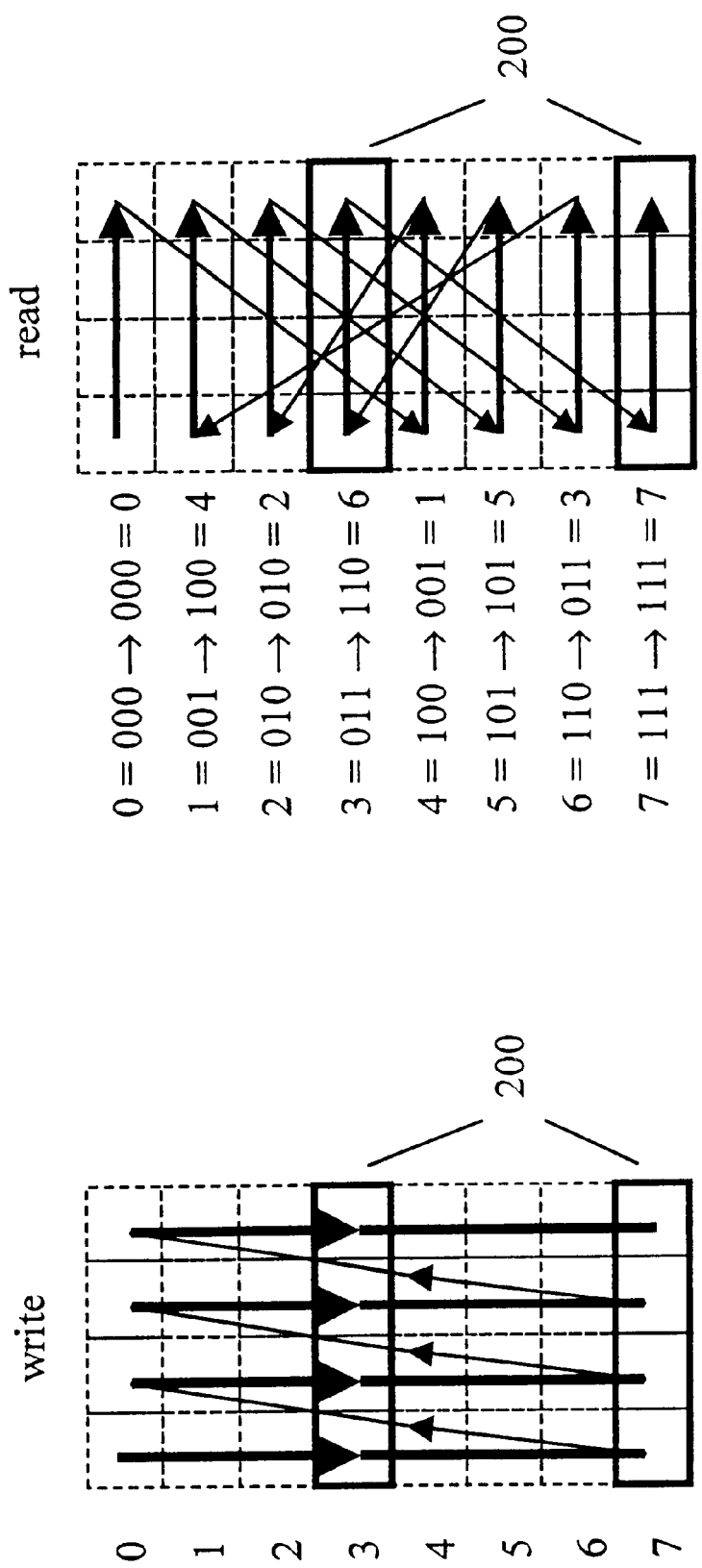

In the second stage, as shown in FIG. 9B, the data block to be interleaved is inputted to interleaver 300 again. In the write cycle of this stage, a second portion of the block is stored into scratchpad 200 using column addressing (here, the portion corresponding to the third and fourth interleaved rows). In the read cycle of this stage, the stored portion is outputted, using row addressing, as the next part of the interleaved block. As shown in FIGS. 9C and 9D, this two-cycle process continues in stages until the entire interleaved block has been outputted.

An example pseudocode segment which implements this embodiment of the invention follows, where the notations are as indicated above, A is an index variable, and 'x+=y' indicates an assignment of the value 'x+y' to the variable x. In this example, m(d) denotes the d-th element of scratchpad 200, and it is assumed that scratchpad 200 has length IR×C (where IR is an integer divisor of R):

```
A=0;
P=R/IR;
n =0;
FOR k=1:P
    FOR j=0:C-1
        FOR i=0:IR-1
            m((i × C) + j) = X((A + i) + (C × (j)));
        end
    end
    WHILE A<R
        FOR i=0:IR-1
            FOR j=0:C-1
                Y(n++) = m((i × C) + j);
            end
        A+=IR;
        end
    end
end
```

This pseudocode segment is included for the purposes of example and description only, and nothing within the code segment or its description should be taken to limit either the scope of this embodiment or the scope of the invention.

Depending upon the nature of control signal a10, address generation unit 210 may be implemented in several different ways. In the discussion below, it is assumed that all scratchpads are addressed as linear arrays, wherein the addresses of the individual storage elements range from 0 to (r×c)−1 (r and c being the number of rows and columns, respectively, in the scratchpad being addressed) and an address d indicates the element at row (d div r) and column (d mod c), where div and mod indicate the integer division and remainder operations.

In one exemplary application, control signal a10 comprises a stream of addresses for performing a block interleaving storage operation using a full-sized R×C scratchpad (i.e. as shown in FIG. 1), and address generation unit 210 maps these addresses into the address space of scratchpad 200. In general, for a scratchpad 200 of arbitrary size s <(R×C), during each i-th stage address generation unit 210 maps each address d in control signal a10 to an address (d mod s) in the space of scratchpad 200, where d is in the range (i−1)×s to (i×s)−1. In the particular case where (R×C)=2^m×s and m is a nonnegative integer, address generation unit 210 maps the addresses of control signal a10 into the space of scratchpad 200 by discarding the most significant m bits of each address. In either case, addresses in control signal a10 that fall outside the range indicated above (i.e. addresses which correspond to symbols which are not to be stored in the current stage) are mapped to nonvalid addresses or are ignored. During the read cycle of each such stage, the elements of the scratchpad may be read out in linear order from address 0 to address s−1.

In another application, control signal a10 provides only a symbol clock indicating the timing of the symbols in the input stream a20, and the write address set must be generated within address generation unit 210. A signal indicating the start of each data block may be provided within signal a10, or address generation unit 210 may maintain such synchronization with the input block boundaries on its own (i.e. by dividing the symbol clock by R×C). One design option is for address generation unit 210 to generate (synchronously to the input symbol stream) a set of write addresses that corresponds to a full-sized R×C scratchpad, mapping this set to the space of scratchpad 200 as described above. Another option is to generate only the addresses within the space of scratchpad 200 such that the destination address of each symbol to be stored is presented to scratchpad 200 at the same time that the symbol appears on input signal a20.

Figure 8B:
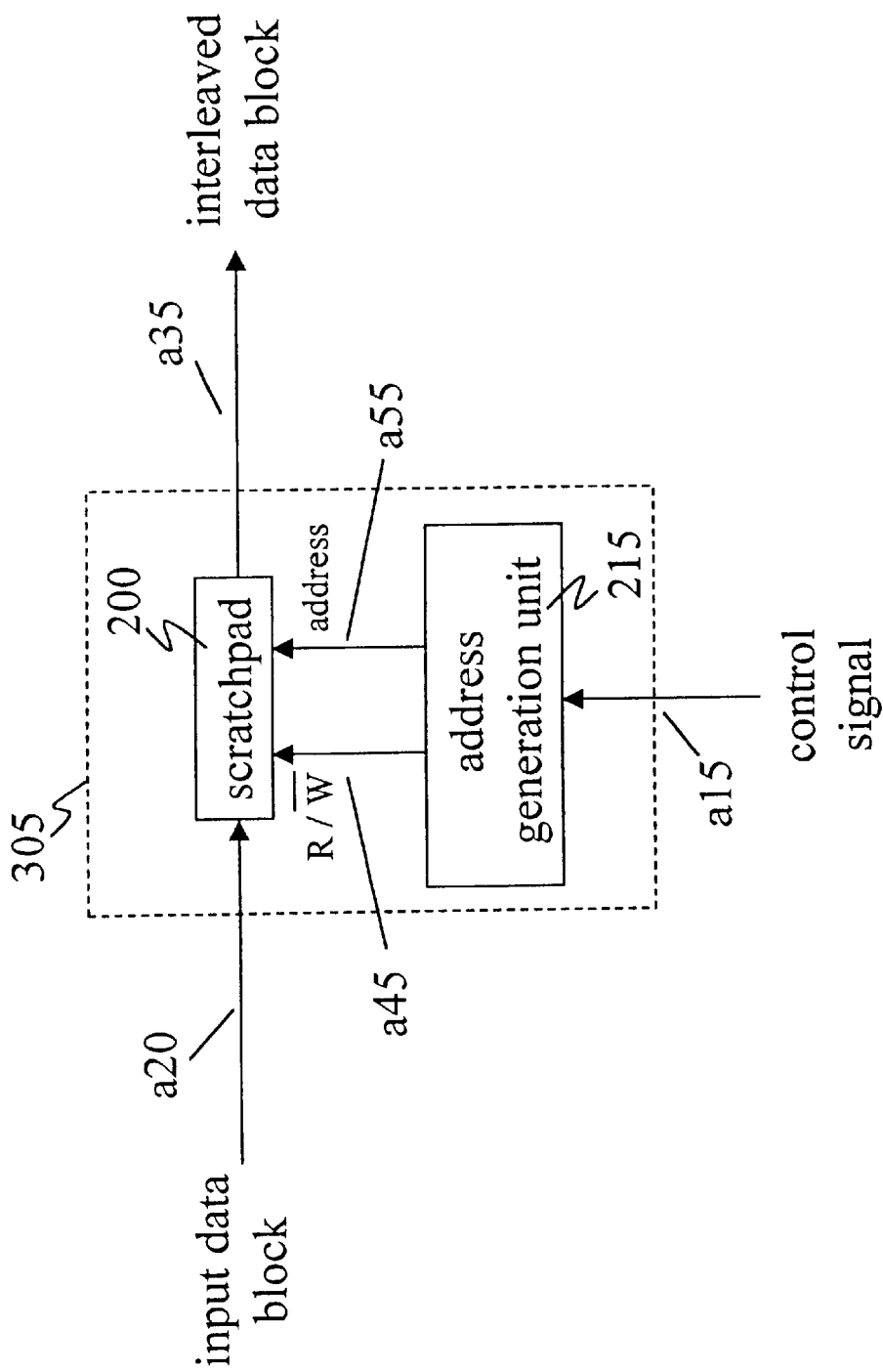
FIG. 8B shows an interleaver 305 according to a second embodiment of the invention.

An interleaver 305 according to a second embodiment of the invention, as shown in FIG. 8B, may be used to perform the block interleaving operation of FIGS. 5 and 6 using bit-reversed addressing. Similarly to interleaver 300, interleaver 305 comprises a scratchpad 200 and an address generation unit 215, wherein scratchpad 200 receives symbols over signal a20, stores input symbols or accesses stored symbols according to a mode select signal a45 provided by address generation unit 215 and an address provided by address generation unit 215 over signal a55, and outputs symbols over signal a35. As shown in FIGS. 10A through 10D, each stage begins as the data block to be interleaved is inputted to interleaver 305 (as with interleaver 300 in the stages of FIGS. 9A through 9D). During each stage and according to the appropriate addressing scheme, a portion of the block is stored which corresponds to the next portion of the interleaved output.

Figure 8C:
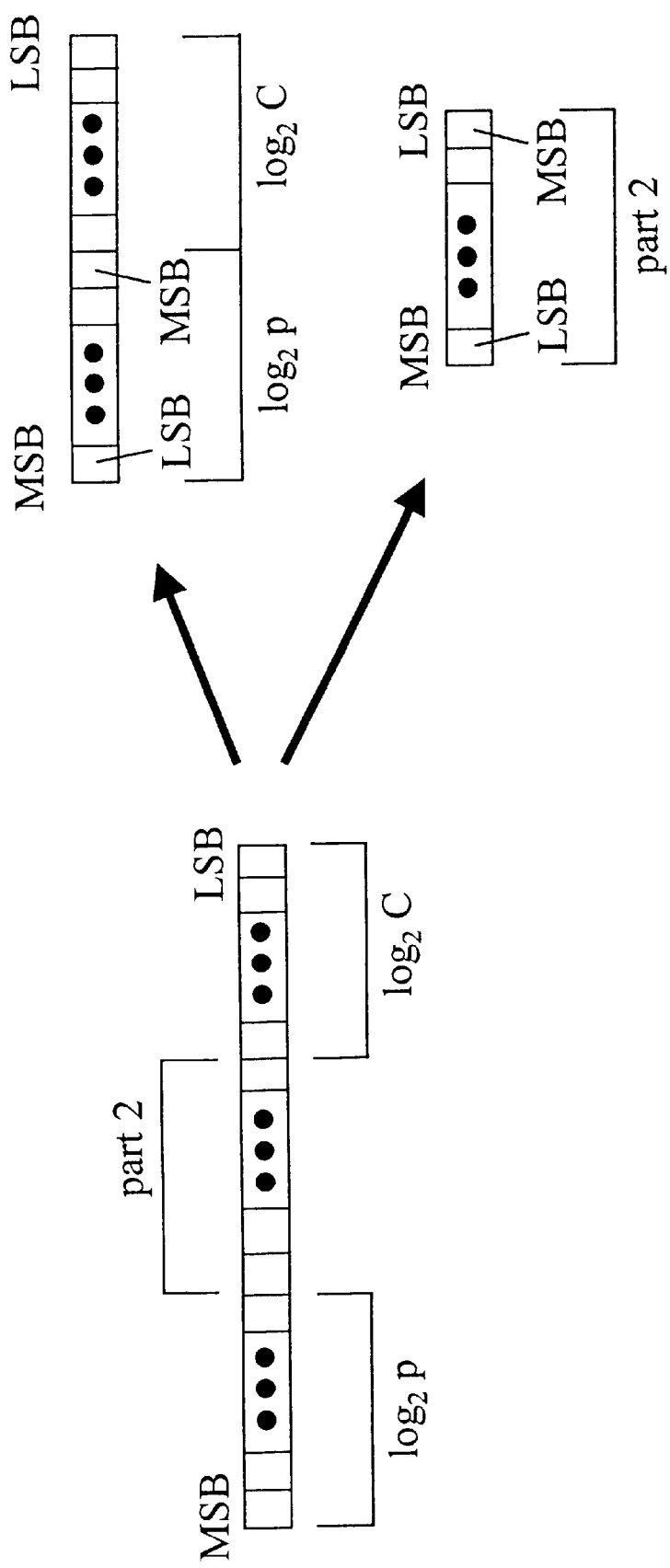
FIG. 8C shows one example of mapping addresses into the address space of scratchpad 200 for performing interleaving using bit-reversed addressing.

FIG. 8C shows one example of how each address for a full-sized R×C scratchpad may be mapped (e.g. by address generation unit 215 ) to an address within scratchpad 200 in order to produce an output a35 that is interleaved using bit-reversed addressing. In this example, it is assumed that scratchpad 200 contains a total of (p×C) storage elements, where p is an integer greater than zero. Note, however, that this assumption is made only with regard to this particular example and does not represent a limitation of the invention in general.

As shown in FIG. 8C, each original address is decomposed into three sections: the ($\log_2$ P) most significant bits (part 1 ), the ($\log_2$ C) least significant bits (part 3 ), and the sequence of bits in between (part 2 ) (in this figure, MSB indicates the most significant bit and LSB indicates the least significant bit). The address of the corresponding storage element in scratchpad 200 is determined by reversing the order of bits in part 1 and concatenating part 3 to the least-significant end of the new sequence. The stage in which a particular original address is mapped into the address space of scratchpad 200 is determined by reversing the sequence of bits of part 2 (where a stage is defined as the combination of a writing operation to scratchpad 200 followed by a reading operation, as shown in each of FIGS. 9A–D and 10A–D). Note that the algorithm of this example describes how the symbols of input signal a20 are written into scratchpad 200. To obtain the interleaved output, the contents of the storage elements of scratchpad 200 may simply be retrieved in order.

An example pseudocode segment which implements this embodiment of the invention follows, where the notations and assumption are as indicated above:

```
A=0;
P=R/IR;
n =0;
FOR k=1:P
    FOR j=0:C−1
        FOR i=0:IR−1
            m((i × C) + j) = X(T(A + i) + (C × j));
        end
    end
WHILE A<R
    FOR i=0:W−1
        FOR j=0:C−1
            Y(n++) = m((i × C) + j);
        end
A+=IR;
    end
end
end
```

This pseudocode segment is included for the purposes of example and description only, and nothing within the code segment or its description should be taken to limit either the scope of this embodiment or the scope of the invention.

Although the examples above demonstrate two 8×4 block interleaving schemes, methods or apparatus according to the disclosed embodiments of the invention may be applied in a similar fashion to any block interleaving scheme, without restriction to any particular choice of R or C and without restriction to any particular addressing scheme or combination of addressing schemes. Likewise, although the interleavers demonstrated above use a scratchpad 200 that is one-fourth of the size of the input data block, note that a scratchpad of any size s <(R×C) may be used.

For a typical application, the size chosen for scratchpad 200 will represent a tradeoff between output symbol rate, input symbol rate, and storage space. In general, reducing the size of the scratchpad by a size reduction factor b (i.e. from R×C to (R×C)/b) requires each block to be inputted b times. Consequently, if p is the time required to input the block once, then the complete block will appear at the output no earlier than time b×p. If a particular output symbol rate is required, the period (b×p) may become a limiting factor, in which case the parameters p and/or b must be adjusted to meet this requirement.

As in any system using a storage unit, the access characteristics of scratchpad 200 will affect the passthrough rate of the interleaver. Note that the choice of parameter b may also influence the complexity of the processing task to be performed by the address generation unit. For example, the addressing scheme generally becomes more complex as size reduction factor b increases. Thus, the choice of parameter b may also affect the passthrough rate (e.g. if the input or output symbol rate exceeds the rate at which addresses are generated). In particular, choosing b to be a nonnegative power of two may reduce the complexity of the task performed by the address generation unit.

Figure 11:
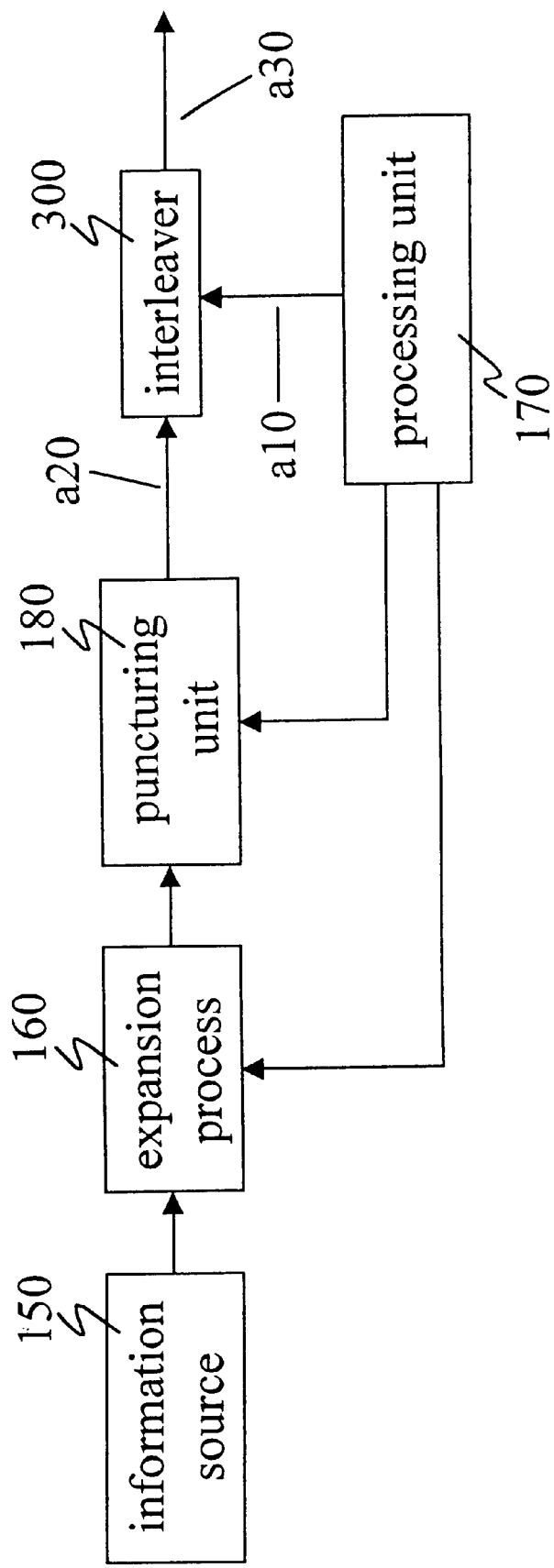
FIG. 11 shows a system for information transmission or storage using an interleaver according to an embodiment of the invention.

FIG. 11 shows an exemplary system for data transmission or storage which incorporates interleaver 300. Information source 150 produces the original stream of information symbols to be transmitted or stored and may comprise a storage unit such as a buffer. Alternatively, information source 150 may comprise a process capable of generating the symbol stream multiple times and at a rate higher than the rate at which the interleaved stream at signal a30 will be consumed. Expansion process 160 introduces redundancy into the stream outputted by information source 150 by, for example, convolutional coding. Puncturing unit 180 provides a simple means for modifying the parameters of the code applied in expansion process 160 by selectively removing symbols from the coded stream. Processing unit 170 synchronizes the functions of each stage and supplies parameters as may be required by each process. Note that an interleaver according to another embodiment of the invention may be substituted for interleaver 300 in a system according to FIG. 11.

In one application, a system according to FIG. 11 is a cellular telephone operating according to at least one among the versions of the IS-95 and IS-96 standards published by the Telecommunications Industry Association (TIA, Arlington, Va.). In this example, information source 150 is a vocoder which receives digitized speech samples and outputs blocks of coded speech data. One example of such a vocoder is disclosed in U.S. Pat. No. 5,414,796, entitled "VARIABLE RATE VOCODER" and assigned to the assignee of the present invention. Expansion process 160 and puncturing unit 180 perform convolutional coding and puncturing functions upon the coded speech data, and the signal a30 outputted by interleaver 300 is forwarded to later stages for pseudonoise spreading and RF modulation and transmission.

Figure 12:
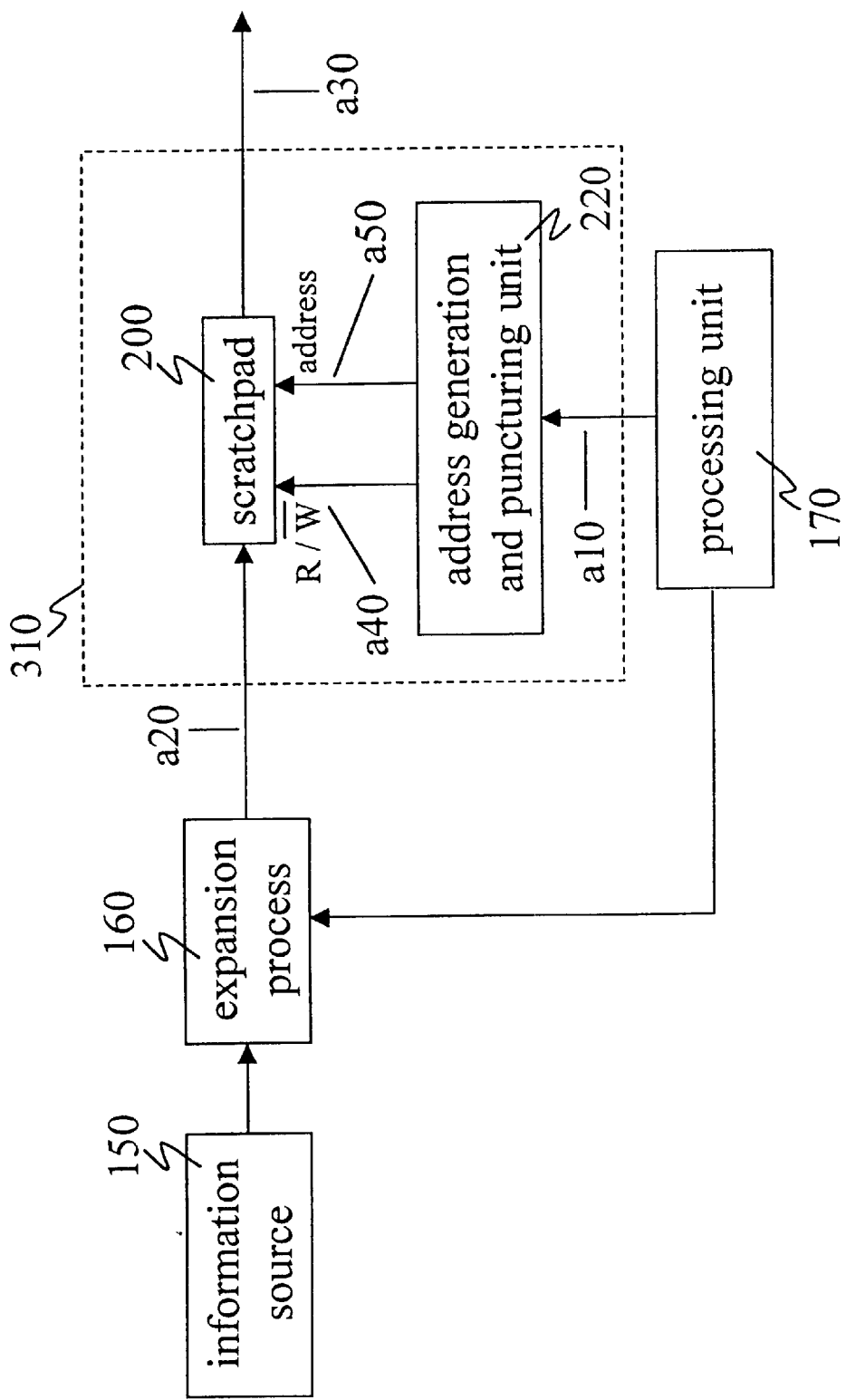
FIG. 12 shows a system for information transmission or storage using an interleaver 310 according to a third embodiment of the invention.

FIG. 12 shows an interleaver 310 according to a third embodiment of the invention. Together with the functions of address generation unit 210 as described above, address generation and puncturing unit 220 performs a puncturing operation on the coded input stream by failing to store certain symbols that would otherwise be mapped into the elements of scratchpad 200. The symbols to be discarded may be indicated according to a predetermined pattern or, in the alternative, according to a pattern defined by processing unit 170.

Figure 13:
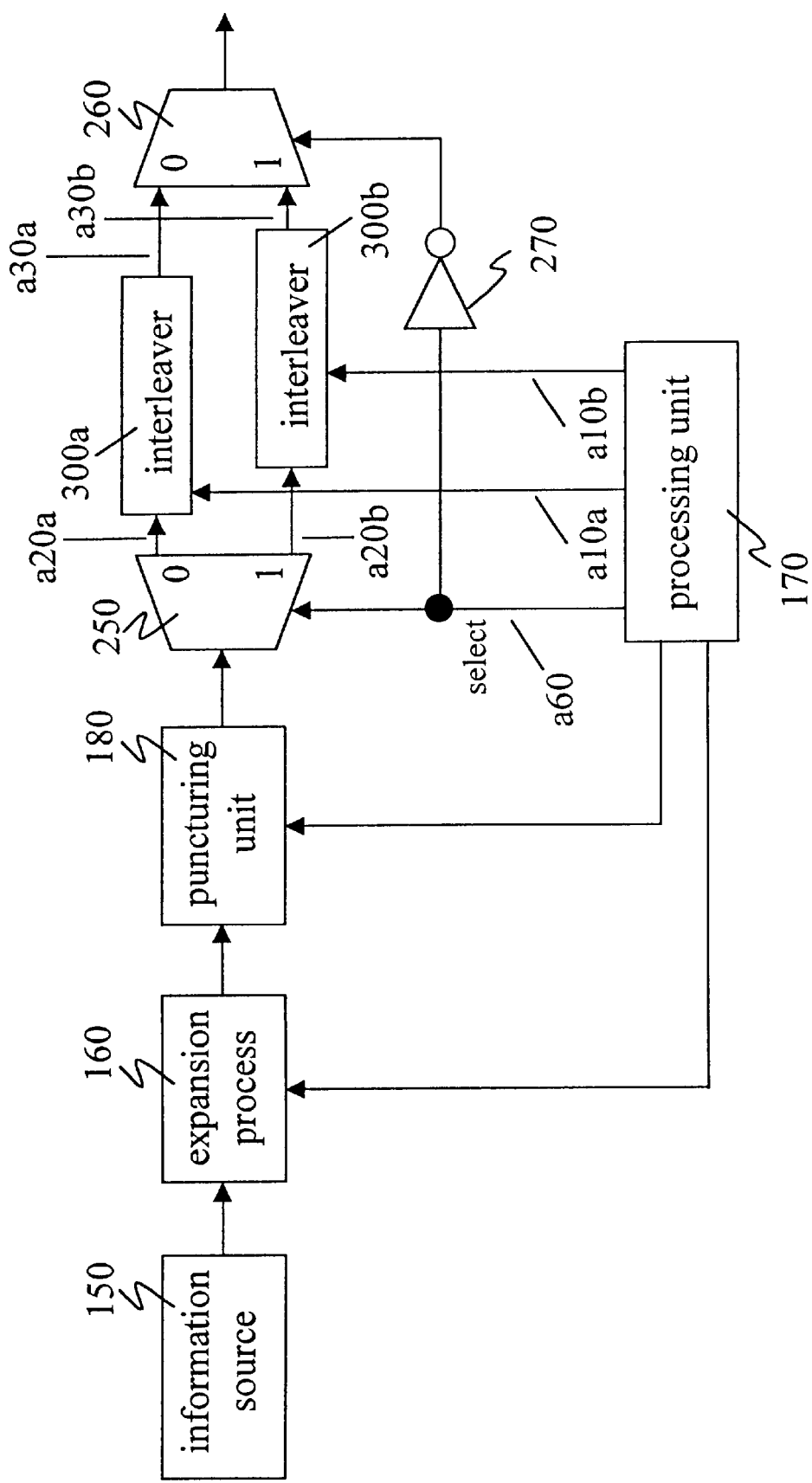
FIG. 13 shows a system for information transmission or storage, using interleavers according to embodiments of the invention, which allows concurrent input and output of data blocks.

If concurrent writing and reading is desired (to support a constant output rate to a subsequent process, for example), a system according to FIG. 11 may be modified as shown in FIG. 13. In this system, processing unit 170 generates a control signal for each of two interleavers 300a and 300b (i.e. control signals a10a and a10b, respectively). Processing unit 170 also generates a select signal a60 which controls the operation of demultiplexer 250 and, through inverter 270, the operation of multiplexer 260. Signal a60 is controlled to change state at each input block boundary such that data inputted through demultiplexer 250 appears alternatingly on signals a20a and a20b (i.e. the input signal lines to interleavers 300a and 300b). While one interleaver is storing a portion of the incoming data block, the other interleaver outputs a previously stored data block portion over the appropriate line a30a or a30b. In accordance with the select signal a60 as inverted by inverter 270, multiplexer 260 passes this stored data block portion to a subsequent process. Note that the system of FIG. 12 may be modified in an analogous fashion so as to perform concurrent writing and reading.

Figure 14:
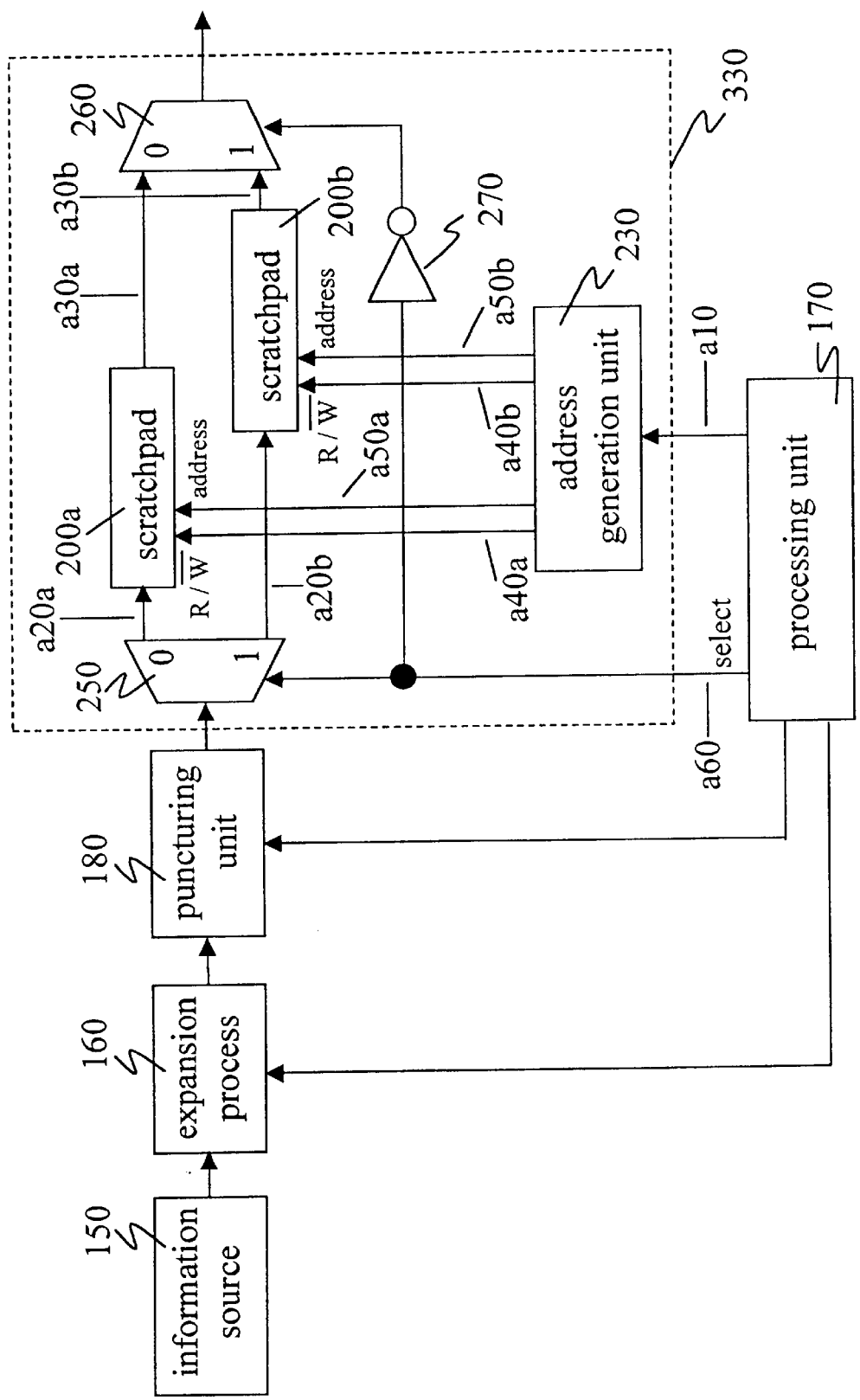
FIG. 14 shows a system for information transmission or storage, using an interleaver 330 according to a fourth embodiment of the invention, which allows concurrent input and output of data blocks.

Alternatively, an interleaver 330 according to a fourth embodiment of the invention may be used for concurrent operation, as shown in FIG. 14. In this embodiment, address generation unit 230 issues read/not write signals a40a, a40b and address signals a50a, a50b to control two scratchpads 200a and 200b, respectively. Symbol input to and output from scratchpads 200a, 200b is alternated by demultiplexer 250 and multiplexer 260, respectively, which are controlled via select signal a60 and its inversion as described above with respect to FIG. 13. Signal a60 may be generated by processing unit 170 as shown; alternatively, this signal may be generated by address generation unit 230 instead. Note that address generation unit 230 may be further modified to incorporate the functions of puncturing unit 180 as described above.

For an even greater reduction in the storage required for a concurrent system as shown in FIG. 14, one may modify the structure of interleaver 330 in accordance with the teachings of U.S. patent application Ser. No. 09/406,172, now U.S. Pat. No. 6,516,360 entitled "METHOD & APPARATUS FOR BUFFERING DATA TRANSMISSION BETWEEN PRODUCER AND CONSUMER," which application is assigned to the assignee of the present invention and is filed concurrently herewith and the disclosure of which application is hereby incorporated by reference.

The foregoing description of the preferred embodiments is provided to enable any person skilled in the art to make or use the present invention. Various modifications to these embodiments are possible, and the generic principles presented herein may be applied to other embodiments.

For example, note that these embodiments may be modified to support writing by row addressing and reading by column addressing, or to support bit-reversed addressing by column rather than by row and/or during writing rather than during reading, or to support other methods of address mapping. Also note that the novel principles presented herein may be applied in a similar fashion to deinterleaving applications.

Additionally, note that the invention may be implemented in part or in whole as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a microprocessor or other digital signal processing unit. Each symbol as stored within an element of the scratchpad may also comprise more than one information element (for example, a symbol may comprise a number of bits or a number of bytes). Thus, the present invention is not limited to the embodiments shown above but rather is to be accorded the widest scope consistent with the principles and novel features disclosed in any fashion herein.

We claim:
1. An apparatus comprising:
 a scratchpad having a plurality of storage elements; and
 an address generation unit coupled to said scratchpad,
 wherein:
  said scratchpad receives a block of symbols;
  the address generation unit divides the block into portions, chooses one of the portions while discarding the portions not chosen by the address generation unit, stores the chosen portion in the scratchpad in a first order, and outputs the stored portion in a second order, the second order being different from the first order, each of said plurality of storage elements storing one of the symbols from the block of symbols;
  wherein the number of symbols in the block is designated as N, the number of said plurality of storage elements is designated as M, and M is less than N.

2. The apparatus according to claim 1, wherein each among said block of symbols comprises a plurality of information elements.

3. The apparatus according to claim 1, each of said plurality of storage elements having a row number and a column number,
wherein the chosen portion is stored into said plurality of storage elements according to a bit-reversed addressing scheme.

4. The apparatus according to claim 1, each of said plurality of storage elements having a row number and a column number,
wherein the stored portion is read from said plurality of storage elements according to a bit-reversed addressing scheme.

5. The apparatus according to claim 1, each of said plurality of storage elements having a row number and a column number,
wherein the chosen portion is stored into said plurality of storage elements based on either a column number order or a row number order, and
wherein the stored portion is read from said plurality of storage elements based on either the column number order if the stored portion was stored with the row number order or the row number order if the stored portion was stored with the column number order.

6. The apparatus of claim 1, wherein said address generation unit receives a plurality of addresses, each among the plurality of addresses corresponding to one among the block of symbols, and
wherein said address generation unit maps at least a portion of the plurality of addresses into an address space of said scratchpad.

7. The apparatus of claim 1, wherein said address generation unit outputs an address signal and a mode select signal to said scratchpad, and
wherein said address signal indicates one among said plurality of storage elements at a time, and
wherein said mode select signal determines whether one among the block of symbols will be stored into or read from the indicated one among the plurality of storage elements.

8. The apparatus of according to claim 7, wherein the address generation unit receives a symbol clock signal, the symbol clock signal having a period substantially related to a period of each among the block of symbols as received by said scratchpad.

9. The apparatus according to claim 1, wherein said apparatus outputs the block of symbols at a substantially constant rate.

10. The apparatus according to claim 1, wherein said scratchpad receives the block of symbols a plurality of times.

11. The apparatus according to claim 10, wherein said apparatus outputs the block of symbols at a substantially constant rate.

12. The apparatus according to claim 10, wherein a portion of the block of symbols is stored into said scratchpad during each of the plurality of times.

13. The apparatus according to claim 12, wherein said apparatus outputs the block of symbols at a substantially constant rate.

14. The apparatus according to claim 12, wherein said address generation unit receives a plurality of addresses, each among the plurality of addresses corresponding to one among the block of symbols, and
wherein said address generation unit maps at least a portion of the plurality of addresses into an address space of said scratchpad.

15. The apparatus according to claim 14, wherein said apparatus outputs the block of symbols at a substantially constant rate.

16. The apparatus according to claim 10, wherein said address generation unit receives a plurality of addresses, each among the plurality of addresses corresponding to one among the block of symbols, and
wherein said address generation unit maps at least a portion of the plurality of addresses into an address space of said scratchpad.

17. The apparatus according to claim 16, wherein said apparatus outputs the block of symbols at a substantially constant rate.

18. An apparatus comprising:
a scratchpad having a plurality of storage elements; and
an address generation unit coupled to said scratchpad,
wherein said apparatus receives a block of symbols, divides the block into portions, and chooses one of the portions while discarding the portions not chosen by the apparatus, and
wherein said scratchpad stores the chosen portion, each of said plurality of storage elements storing one of the symbols from the block of symbols at a time, and
wherein said scratchpad outputs the stored portion of the block of symbols in a second order, the second order being different from the first order,
wherein the number of symbols in the block is designated as N, the number of said plurality of storage elements is designated as M, and M is less than N.

19. The apparatus according to claim 18, each of said plurality of storage elements having a row number and a column number,
wherein a portion of the block of symbols is stored into said plurality of storage elements according to a bit-reversed addressing scheme.

20. The apparatus according to claim 18, each of said plurality of storage elements having a row number and a column number,
wherein a portion of the block of symbols is read from said plurality of storage elements according to a bit-reversed addressing scheme.

21. The apparatus according to claim 18, each of said plurality of storage elements having a row number and a column number,
wherein a portion of the block of symbols is stored into said plurality of storage elements based on either a column number order or a row number order, and
wherein the stored portion of the block of symbols is read from said plurality of storage elements based on either the column number order if the stored portion was stored with the row number order or the row number order if the stored portion was stored with the column number order.

22. A method comprising:
receiving a block of symbols;
dividing the block into portions;
choosing one of the portions;
discarding the portions not chosen;
storing the chosen portion in a scratchpad in a first order;
outputting the stored portion in a second order,
wherein said scratchpad comprises a plurality of storage elements, and wherein the number of symbols in the block is designated as N, the number of said plurality of storage elements is designated as M, and M is less than N.

23. The method according to claim 22, each of said plurality of storage elements having a row number and a column number, wherein the chosen portion is stored into said plurality of storage elements according to a bit-reversed addressing scheme.

24. The method according to claim 22, each of said plurality of storage elements having a row number and a column number, wherein the stored portion is read from said plurality of storage elements according to a bit-reversed addressing scheme.

25. The apparatus according to claim 22, each of said plurality of storage elements having a row number and a column number, wherein the chosen portion is stored into said plurality of storage elements based on either a column number order or a row number order, and wherein the stored portion is read from said plurality of storage elements based on either the column number order if the stored portion was stored with the row number order or the row number order if the stored portion was stored with the column number order.

26. A data storage medium, said medium bearing machine-readable code, such code being instructions executable by an array of logic elements such as a microprocessor or other digital signal processing unit, said instructions defining a method comprising:

receiving a block of symbols;

dividing the block of symbols into portions;

choosing one of the portions;

discarding the portions not chosen;

storing the chosen portion in a scratchpad in a first order; and outputting the stored portion in a second order, wherein said scratchpad comprises a plurality of storage elements, and wherein the number of symbols in the block is designated as N, the number of said plurality of storage elements is designated as M, and M is less than N.

27. An integrated circuit, said circuit comprising an array of logic elements, said array being configured to perform a method comprising:

receiving a block of symbols;

dividing the block into portions;

choosing one of the portions;

discarding the portions not chosen;

storing the chosen potion in a scratchpad in a first order; and outputting the stored portion in a second order, wherein said scratchpad comprises a plurality of storage elements, and wherein the number of symbols in the block is designated as N, the number of said plurality of storage elements is designated as M, and M is less than N.

28. The integrated circuit according to claim 27, each of said plurality of storage elements having a row number and a column number, wherein a portion of the block of symbols is stored into said plurality of storage elements according to a bit-reversed addressing scheme.

29. The integrated circuit according to claim 27, each of said plurality of storage elements having a row number and a column number, wherein a portion of the block of symbols is read from said plurality of storage elements according to a bit-reversed addressing scheme.

30. The integrated circuit according to claim 27, each of said plurality of storage elements having a row number and a column number, wherein a portion of the block of symbols is stored into said plurality of storage elements based on either a column number order or a row number order, and wherein the stored portion of the block of symbols is read from said plurality of storage elements based on either the column number order if the stored portion was stored with the row number order or the row number order if the stored portion was stored with the column number order.

31. An apparatus comprising:

a plurality of scratchpads, each scratchpad having a plurality of storage elements;

an address generation unit coupled to each among said plurality of scratchpads;

a demultiplexer coupled to each among said plurality of scratchpads and receiving a block of symbols and a first select signal, the address generation unit dividing the block into portions, choosing one of the portions, discarding the portions not chosen and storing the chosen portion in one of the scratchpads in a first order; and a multiplexer coupled to each among said plurality of scratchpads and receiving a second select signal, and outputting the stored portion in a second order, the second order being different from the first order, wherein each of said plurality of storage elements is capable of storing one of the symbols from the received block of symbols, wherein the number of symbols in the block is designated as N, a maximum number of said plurality of storage elements in each of said scratchpads is M, and M is less than N.

32. The apparatus according to claim 31, wherein the second select signal is an inversion of the first select signal.

* * * * *